United States Patent
Hosokawa et al.

(10) Patent No.: US 10,074,648 B2
(45) Date of Patent: Sep. 11, 2018

(54) METHOD OF MANUFACTURING SEMICONDUCTOR DEVICE

(71) Applicant: TOYOTA JIDOSHA KABUSHIKI KAISHA, Toyota-shi, Aichi-ken (JP)

(72) Inventors: Hiroshi Hosokawa, Toyota (JP); Shinya Iwasaki, Toyota (JP); Tsuyoshi Nishiwaki, Nagoya (JP); Atsushi Imai, Toyota (JP); Shuhei Oki, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/718,749

(22) Filed: Sep. 28, 2017

(65) Prior Publication Data
US 2018/0138170 A1   May 17, 2018

(30) Foreign Application Priority Data
Nov. 15, 2016   (JP) .................. 2016-222534

(51) Int. Cl.
| | | |
|---|---|---|
| *H01L 21/04* | (2006.01) | |
| *H01L 27/07* | (2006.01) | |
| *H01L 29/32* | (2006.01) | |
| *H01L 29/08* | (2006.01) | |
| *H01L 21/265* | (2006.01) | |
| *H01L 21/8249* | (2006.01) | |
| *H01L 21/268* | (2006.01) | |
| *H01L 29/861* | (2006.01) | |
| *H01L 29/739* | (2006.01) | |

(52) U.S. Cl.
CPC ........ *H01L 27/0716* (2013.01); *H01L 21/268* (2013.01); *H01L 21/26513* (2013.01); *H01L 21/8249* (2013.01); *H01L 27/0727* (2013.01); *H01L 29/08* (2013.01); *H01L 29/32* (2013.01); *H01L 29/7397* (2013.01); *H01L 29/8611* (2013.01)

(58) Field of Classification Search
None
See application file for complete search history.

(56) References Cited

U.S. PATENT DOCUMENTS

| | | | | |
|---|---|---|---|---|
| 2012/0178223 | A1* | 7/2012 | Nishijo | ............ H01L 29/66348 |
| | | | | 438/138 |
| 2015/0024556 | A1* | 1/2015 | Miyazaki | ............... H01L 29/32 |
| | | | | 438/138 |
| 2017/0221712 | A1* | 8/2017 | Kudo | ............... H01L 21/02694 |

FOREIGN PATENT DOCUMENTS

JP   2008-192737 A   8/2008

* cited by examiner

*Primary Examiner* — Bradley K Smith
(74) *Attorney, Agent, or Firm* — Oliff PLC

(57) ABSTRACT

A method of manufacturing a semiconductor device includes: implanting charged particles into a first range and a second range in a semiconductor substrate from at least one of a first surface of the semiconductor substrate and a second surface of the semiconductor substrate located on an opposite side of the first surface so as to increase crystal defect densities in the first range and the second range; implanting n-type impurities into the first range from the first surface so as to make a region amorphous, the region being in the first range and disposed at the first surface; irradiating the first surface with first laser after the implantation of the charged particles and the implantation of the n-type impurities so as to heat the first range and the second range; and crystallizing the region which has been made amorphous in or after the irradiation of the first laser.

4 Claims, 4 Drawing Sheets

METHOD OF MANUFACTURING SEMICONDUCTOR DEVICE

TECHNICAL FIELD

Art disclosed herein relates to a method of manufacturing a semiconductor device.

BACKGROUND

Japanese Patent Application Publication No. 2008-192737 discloses a semiconductor device including an IGBT and a diode (i.e., a so-called RC-IGBT (Reverse Conducting-Insulated Gate Bipolar Transistor)). A region in which a crystal defect density is increased by implantation of charged particles (referred hereinafter as "crystal defect region") is provided inside the diode. No crystal defect region is provided outside of the diode (e.g., inside the IGBT). In the crystal defect region, carrier lifetime is short. A reverse recovery characteristic of the diode can be improved by providing the crystal defect region inside the diode.

SUMMARY

In case of forming a crystal defect region in a diode, if a position of the crystal defect region is misaligned from a cathode region (n-type region) of the diode, it becomes difficult to control a characteristic of the diode to a desired characteristic. Further, if the position of the crystal defect region is misaligned from the cathode region of the diode, characteristic(s) of semiconductor region(s) outside of the diode alter, which is problematic. For example, if the crystal defect region is formed misaligned from the cathode region and closer to the IGBT in the semiconductor device in Japanese Patent Application Publication No. 2008-192737, an ON-potential of the IGBT will rise and a loss generated in the IGBT will increase.

In a conventional manufacturing method of a semiconductor device, a crystal defect region is formed by implanting charged particles to a semiconductor substrate via a mask, and a cathode region is formed by implanting n-type impurities to the semiconductor substrate via another mask. It is difficult to correctly align a position of the mask for charged particle implantation and a position of the mask for n-type impurity implantation. Due to this, there had been a problem with the conventional manufacturing method where a relative positional misalignment between the crystal defect region and the cathode region occurs, resulting in unstable characteristic(s) of the diode and of the semiconductor region(s) outside of the diode. Therefore, the present teachings provide a method of manufacturing a semiconductor device that allows suppressing the relative positional misalignment between a cathode region and a crystal defect region.

The present teachings disclose a method of manufacturing a semiconductor device including a diode. The method may comprise: implanting charged particles into a first range and a second range in a semiconductor substrate from at least one of a first surface of the semiconductor substrate and a second surface of the semiconductor substrate located on an opposite side of the first surface so as to increase crystal defect densities in the first range and the second range; implanting n-type impurities into the first range from the first surface so as to make a region amorphous, the region being in the first range and disposed at the first surface; irradiating the first surface with first laser after the implantation of the charged particles and the implantation of the n-type impurities so as to heat the first range and the second range; and crystallizing the region which has been made amorphous in or after the irradiation of the first laser.

Either of the charged particles or the n-type impurities may be implanted earlier than the other.

According to this manufacturing method, in the charged particle implantation, the crystal defect densities in both the first range and the second range increase. Further, in the n-type impurity implantation, the n-type impurities are implanted in the first range and the region disposed at the first surface in the first range is made amorphous. In the second range, a region made amorphous (i.e., amorphous region) is not formed. In other words, a range where the amorphous region is formed is the first range. After the charged particle implantation and the n-type impurity implantation, a heating process is performed. In the heating process, the first range and the second range are heated by irradiating the first surface with laser. At this occasion, there exists in the first range an amorphous region at a position disposed at the first surface. As the amorphous region has a low thermal conductivity, heat does not transfer at a great degree to a deeper side of the amorphous region (i.e., surface portion on a first surface side). Due to this, in the first range, many of the crystal defects inside the first range are not eliminated but do remain. In the second range, as no amorphous region exists, the range is heated over a wide range in its depth direction and many crystal defects are eliminated. Therefore, after the heating process, a distribution can be obtained where the first range has a high crystal defect density and the second range has a low crystal defect density. That is, the crystal defect region can be formed in the first range. Thereafter, the amorphous region is crystallized. Since the amorphous region contains n-type impurities, the crystallized region becomes an n-type semiconductor region. This n-type semiconductor region becomes a cathode region of a diode. As described above, because the amorphous region allows a range where the elimination of crystal defects is suppressed to be fixed, the amorphous region allows a position of a crystal defect region to be determined. Further, the amorphous region becomes a cathode region in a later process. Therefore, a relative positional misalignment between the crystal defect region and the cathode region rarely occurs. Due to this, according to this manufacturing method, variations in characteristic(s) of semiconductor devices upon their mass production can be suppressed.

DETAILED DESCRIPTION

Figure 1:
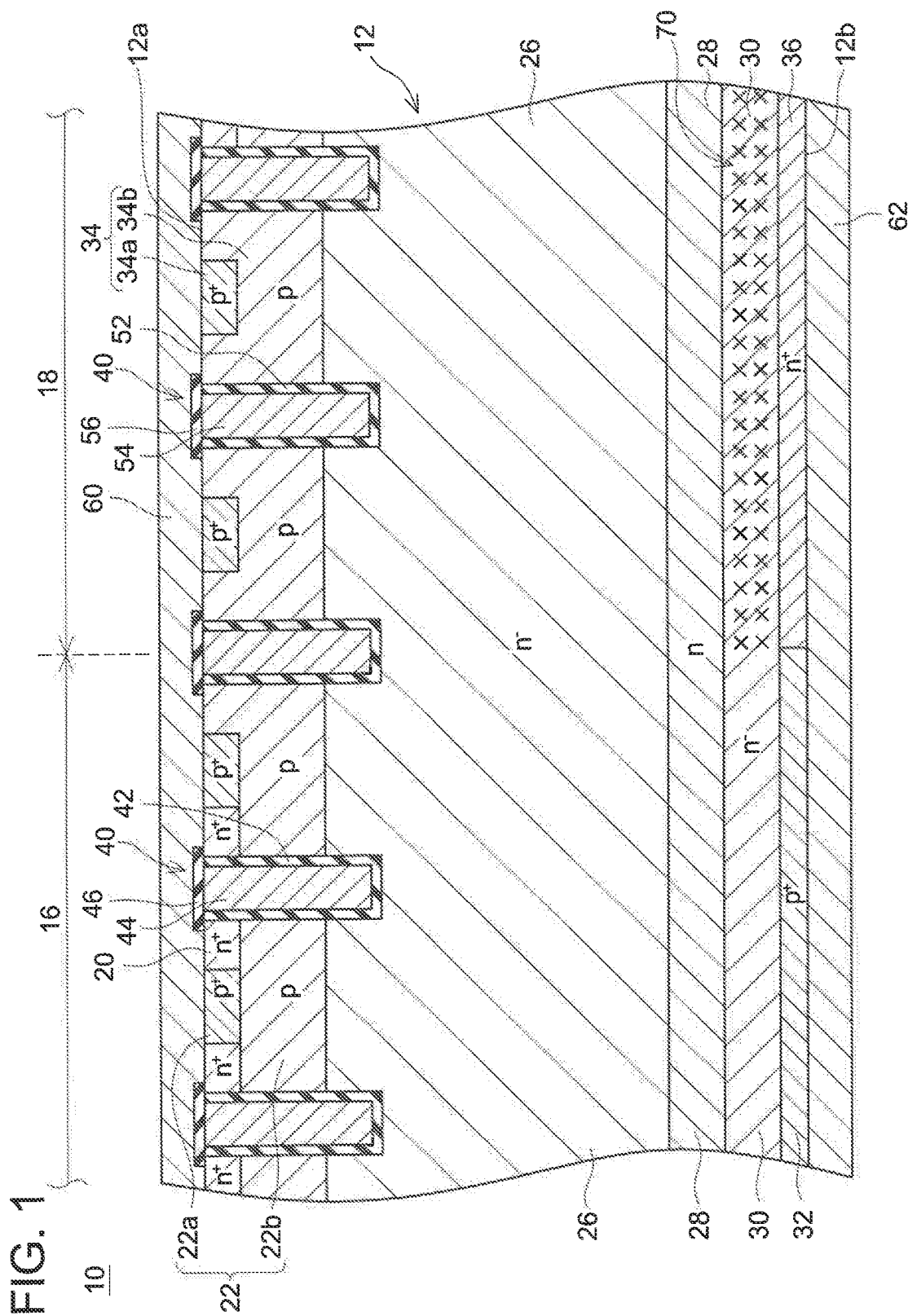
FIG. 1 illustrates a cross sectional view of a semiconductor device.

FIG. 1 shows a semiconductor device 10 manufactured by a method according to a present embodiment. The semiconductor device 10 comprises a semiconductor substrate 12, electrodes, insulators and the like arranged on an upper surface 12a and a lower surface 12b of the semiconductor substrate 12. The semiconductor substrate 12 is constituted of silicon. The semiconductor substrate 12 comprises an IGBT region 16 and a diode region 18. In a plan view of the semiconductor substrate 12 along its thickness direction, the IGBT region 16 and the diode region 18 adjoin each other. An IGBT is provided in the IGBT region 16, while a diode is provided in the diode region 18. That is, the semiconductor device 10 is a so-called RC-IGBT.

A plurality of trenches 40 is provided at the upper surface 12a of the semiconductor substrate 12. Each trench 40 extends parallel to each other in a vertical direction relative to a sheet surface of FIG. 1.

An inner surface of each trench 40 in the IGBT region 16 is covered with a gate insulation film 42. A gate electrode 44 is disposed inside each trench 40 in the IGBT region 16. Each gate electrode 44 is insulated from the semiconductor substrate 12 by its corresponding gate insulation film 42. A front surface of each gate electrode 44 is covered with an interlayer insulation film 46.

An inner surface of each trench 40 in the diode region 18 is covered with an insulation film 52. A control electrode 54 is disposed inside each trench 40 in the diode region 18. Each control electrode 54 is insulated from the semiconductor substrate 12 by its corresponding insulation film 52. A front surface of each control electrode 54 is covered with an interlayer insulation film 56. A potential of the control electrodes 54 is independent from a potential of the gate electrodes 44.

An upper electrode 60 is disposed on the upper surface 12a of the semiconductor substrate 12. The upper electrode 60 is insulated from the gate electrodes 44 by the respective interlayer insulation films 46, and insulated from the control electrodes 54 by the respective interlayer insulation films 56. A lower electrode 62 is disposed on the lower surface 12b of the semiconductor substrate 12.

Inside the IGBT region 16, emitter regions 20, a body region 22, a drift region 26, a buffer region 28, a low concentration region 30, and a collector region 32 are provided.

Each emitter region 20 is an n-type region and situated at the upper surface 12a of the semiconductor substrate 12. The emitter regions 20 are in ohmic contact with the upper electrode 60. Each emitter region 20 is in contact with the corresponding gate insulation film 42.

The body region 22 comprises body contact regions 22a and a low concentration body region 22b. Each body contact region 22a is a p-type region containing p-type impurities in high concentration. Each body contact region 22a is situated at the upper surface 12a of the semiconductor substrate 12. Each body contact region 22a is adjacent to the corresponding emitter region 20. The body contact regions 22a are in ohmic contact with the upper electrode 60. The low concentration body region 22b is a p-type region of which p-type impurity concentration is lower than that of the body contact regions 22a. The low concentration body region 22b is disposed under the emitter regions 20 and the body contact regions 22a. The low concentration body region 22b is in contact with the gate insulation films 42 under the emitter regions 20.

The drift region 26 is an n-type region containing n-type impurities in lower concentration than the emitter regions 20. The drift region 26 is disposed under the low concentration body region 22b. The drift region 26 is separated from the emitter regions 20 by the low concentration body region 22b. The drift region 26 is in contact with the gate insulation films 42 under the low concentration body region 22b.

The buffer region 28 is an n-type region containing n-type impurities in higher concentration than the drift region 26. The buffer region 28 is disposed under the drift region 26.

The low concentration region 30 is an n-type region containing n-type impurities in substantially same concentration as that of the drift region 26. The low concentration region 30 is disposed under the buffer region 28.

The collector region 32 is a p-type region. The collector region 32 is disposed under the low concentration region 30. The collector region 32 is situated at the lower surface 12b of the semiconductor substrate 12. The collector region 32 is in ohmic contact with the lower electrode 62.

In the IGBT region 16, an IGBT connected between the upper electrode 60 and the lower electrode 62 is constituted by the emitter regions 20, the body region 22, the drift region 26, the buffer region 28, the low concentration region 30, the collector region 32, and the gate electrodes 44, etc. When the semiconductor device 10 operates as the IGBT, the upper electrode 60 works as an emitter electrode and the lower electrode 62 works as a collector electrode.

Inside the diode region 18, anode regions 34, the drift region 26, the buffer region 28, the low concentration region 30, and a cathode region 36 are provided. The drift region 26, the buffer region 28, and the low concentration region 30 are shared between the IGBT region 16 and the diode region 18.

The anode region 34 comprises anode contact regions 34a and a low concentration anode region 34b. The anode contact regions 34a are p-type regions containing p-type impurities in high concentration. Each anode contact region 34a is situated at the upper surface 12a of the semiconductor substrate 12. Each anode contact region 34a is in ohmic contact with the upper electrode 60. The low concentration anode region 34b is a p-type region of which p-type impurity concentration is lower than that of the anode contact regions 34a. The low concentration anode region 34b is arranged in surroundings of each anode contact region 34a. The low concentration anode region 34b is in contact with each insulation film 52.

The drift region 26 in the diode region 18 is continuous with the drift region 26 in the IGBT region 16. The drift region 26 in the diode region 18 is arranged under the low concentration anode region 34b, and in contact with each insulation film 52 under the low concentration anode region 34b.

The buffer region 28 in the diode region 18 is continuous with the buffer region 28 in the IGBT region 16. In the diode region 18 also, the buffer region 28 is arranged under the drift region 26.

The low concentration region 30 in the diode region 18 is continuous with the low concentration region 30 in the IGBT region 16. In the diode region 18 also, the low concentration region 30 is arranged under the buffer region 28.

The cathode region 36 is an n-type region containing n-type impurities in higher concentration than that of the buffer region 28. The cathode region 36 is arranged under the low concentration region 30. The cathode region 36 adjoins the collector region 32. The cathode region 36 is disposed at the lower surface 12b of the semiconductor substrate 12. The cathode region 36 is in ohmic contact with the lower electrode 62.

In the diode region 18, a pn diode connected between the upper electrode 60 and the lower electrode 62 is constituted by the anode region 34, the drift region 26, the buffer region 28, the low concentration region 30, and the cathode region 36, etc. When the semiconductor device 10 operates as a diode, the upper electrode 60 works as an anode electrode and the lower electrode 62 works as a cathode electrode. That is, the diode is connected anti-parallel to the IGBT.

In the diode region 18, a crystal defect region 70 is provided. The crystal defect region 70 is a semiconductor region of which crystal defect density is higher than those of its surrounding semiconductor regions. The crystal defect region 70 is arranged within the low concentration region 30 in the diode region 18. In the low concentration region 30 in the IGBT region 16, no crystal defect region 70 is provided. That is, a crystal defect density in the low concentration region 30 in the diode region 18 is higher than a crystal defect density in the low concentration region 30 in the IGBT region 16. Crystal defects serve as recombination centers for carriers. Therefore, in the low concentration region 30 in the diode region 18 (i.e., inside of the crystal defect region 70), carrier life time is shorter than in the low concentration region 30 in the IGBT region 16 (i.e., outside of the crystal defect region 70).

Next, operations of the semiconductor device 10 will be explained. Firstly, an operation of the IGBT will be described. The IGBT is turned on by applying a higher potential to the lower electrode 62 than to the upper electrode 60 and applying a gate potential higher than a threshold to the gate electrodes 44. That is, the application of the gate potential causes a channel to be formed in a part of the low concentration body region 22b adjacent to each gate insulation film 42. Due to this, electrons flow from the upper electrode 60 through the emitter regions 20, the channels, the drift region 26, the buffer region 28, the low concentration region 30, and the collector region 32 to the lower electrode 62. Also, holes flow from the lower electrode 62 through the collector region 32, the low concentration region 30, the buffer region 28, the drift region 26, the low concentration body region 22b, and the body contact regions 22a to the upper electrode 60. Since no crystal defect region 70 is provided in the IGBT region 16, the electrons and holes are unlikely to be inhibited from flowing smoothly by crystal defects. Therefore, an on-potential of the IGBT is low.

Subsequently, operations of the diode will be described. When the diode is to be turned on, a voltage that makes the upper electrode 60 have a higher potential than the lower electrode 62 is applied. Then, holes flow from the upper electrode 60 through the anode contact regions 34a, the low concentration anode region 34b, the drift region 26, the buffer region 28, the low concentration region 30, and the cathode region 36 to the lower electrode 62. Also, electrons flow in a reverse direction to the holes. Thereafter, by switching the voltage between the lower electrode 62 and the upper electrode 60 to a reverse voltage, the diode performs reverse recovery operation. That is, carriers that had accumulated in the diode region 18 are discharged to the upper electrode 60 and the lower electrode 62. Due to this, reverse current flows in the diode, generating a loss. However, in this semiconductor device 10, the crystal defect region 70 having a high crystal defect density is provided in the low concentration region 30 in the diode region 18. When the diode performs the reverse recovery operation, a large number of carriers annihilate by recombination in the crystal defect region 70. Due to this, the reverse current of the diode is suppressed. Consequently, the loss generated in the diode is made less.

Next, a method of manufacturing the semiconductor device 10 will be described. Firstly, an unprocessed semiconductor substrate 12 (semiconductor substrate entirely constituted of an n-type region having an n-type impurity concentration substantially same as that of the drift region 26) is prepared. Subsequently, structures of an upper surface 12a side of the semiconductor device 10 (i.e., the upper electrode 60, the interlayer insulation films 46, the trenches 40, the gate insulation films 42, the gate electrodes 44, the insulation films 52, the control electrodes 54, the emitter regions 20, the body region 22, and the anode region 34, etc.) are formed in the semiconductor substrate 12.

Figure 2:
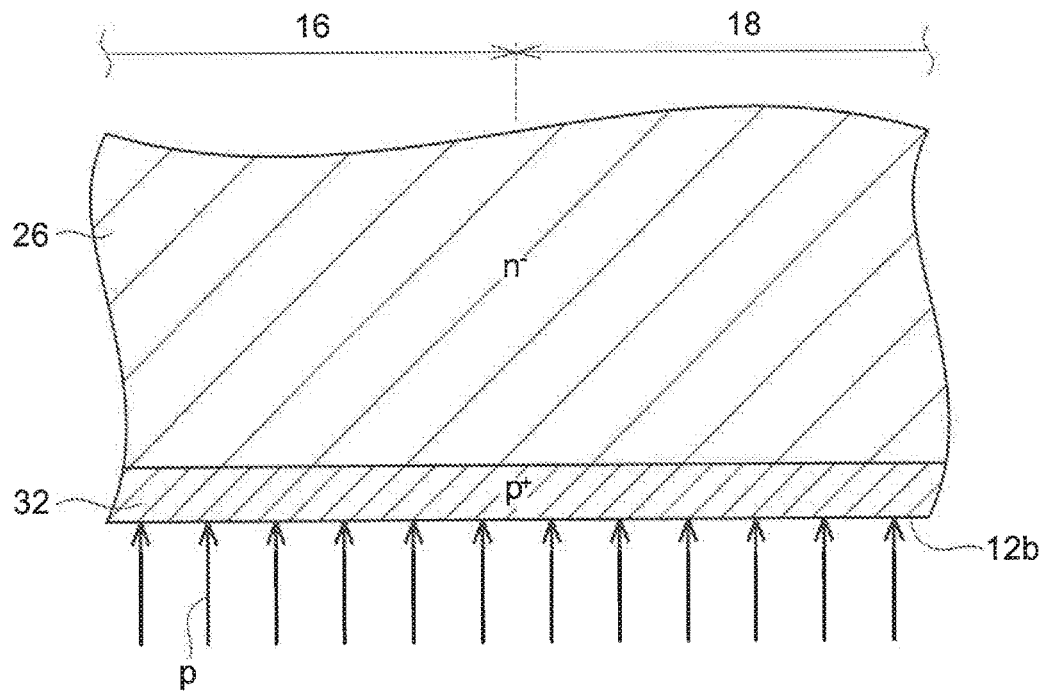
FIG. 2 illustrates an explanatory drawing for a process of forming a collector region.

Next, as shown in FIG. 2, p-type impurities are implanted to the semiconductor substrate 12 from the lower surface 12b. At this occasion, the p-type impurities are implanted to an entirety of the lower surface 12b including the IGBT region 16 and the diode region 18. Further at this occasion, implantation energy is adjusted such that the p-type impurities stop at a semiconductor region in vicinity of the lower surface 12b. Thereafter, by annealing the semiconductor substrate 12 to activate the p-type impurities therein, a p-type collector region 32 is formed in an entirety of a range exposed at the lower surface 12b.

Figure 3:
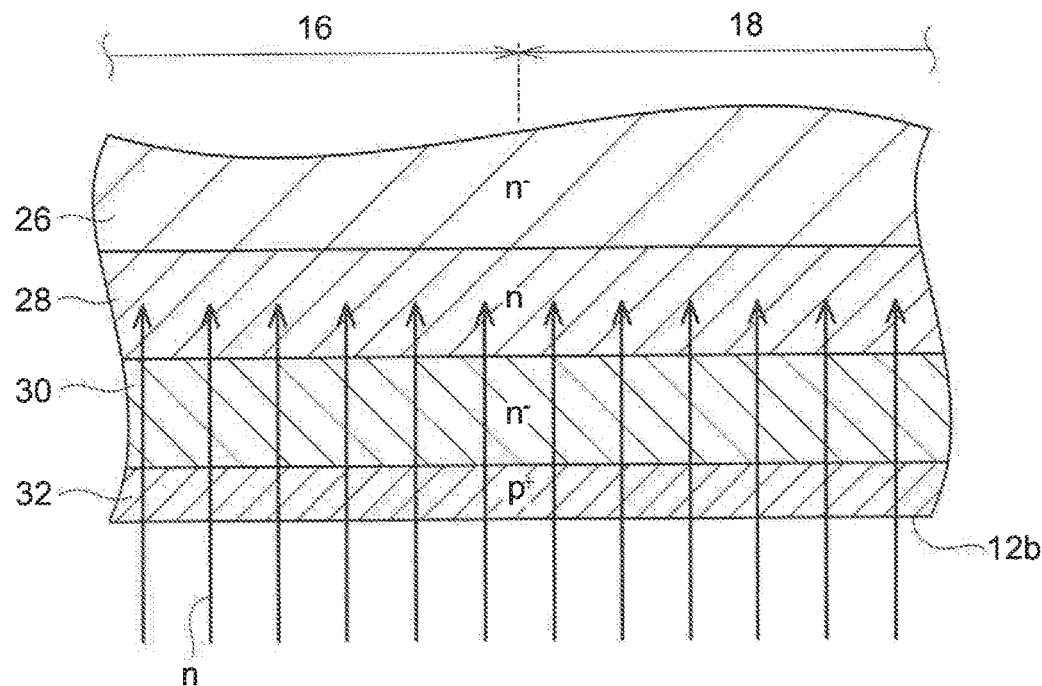
FIG. 3 illustrates an explanatory drawing for a process of forming a buffer region.

Subsequently, as shown in FIG. 3, n-type impurities are implanted to the semiconductor substrate 12 from the lower surface 12b. At this occasion, the n-type impurities are implanted in the entirety of the lower surface 12b including the IGBT region 16 and the diode region 18. Further at this occasion, implantation energy is adjusted such that the n-type impurities stop at a deeper spot than the collector region 32. Thereafter, by annealing the semiconductor substrate 12 to activate the n-type impurities therein, the buffer region 28 is formed. The buffer region 28 is formed at a spot spaced apart from the collector region 32. An n-type region between the buffer region 28 and the collector region 32 (i.e., an n-type region in which the original n-type impurity concentration is maintained) becomes the low concentration region 30.

Figure 4:
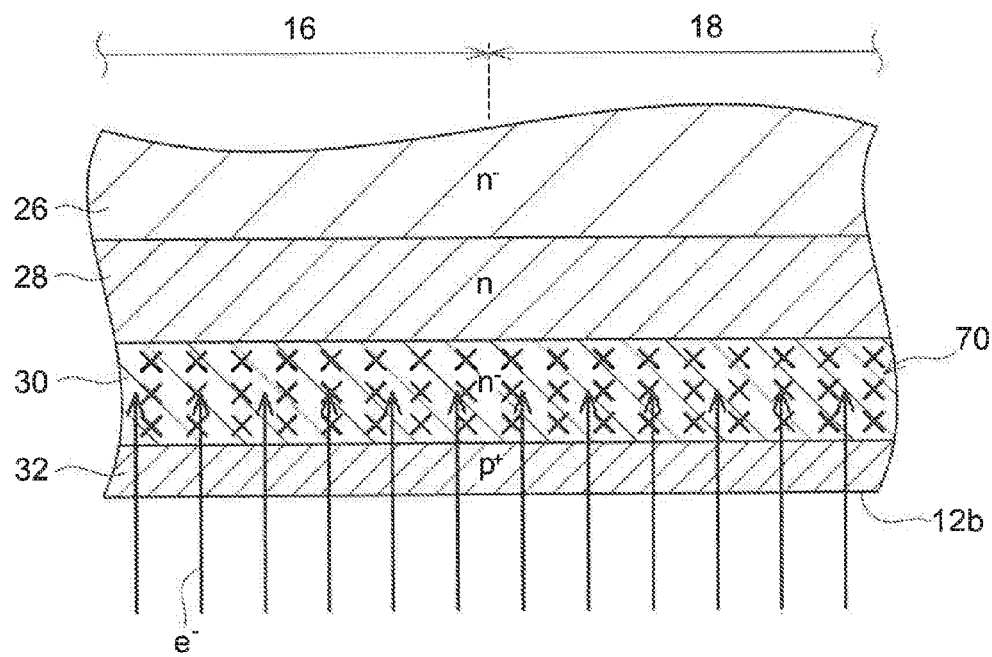
FIG. 4 illustrates an explanatory drawing for a process of forming crystal defects.

Subsequently, as shown in FIG. 4, electrons are implanted to the semiconductor substrate 12 from the lower surface 12b. At this occasion, the electrons are implanted to the entirety of the lower surface 12b including the IGBT region 16 and the diode region 18. The implantation of the electrons forms crystal defects in the semiconductor substrate 12. At this occasion, implantation energy of the electrons is adjusted such that crystal defects are formed with a high density in the low concentration region 30. Due to this, the crystal defect region 70 is formed across the IGBT region 16 and the diode region 18.

Figure 5:
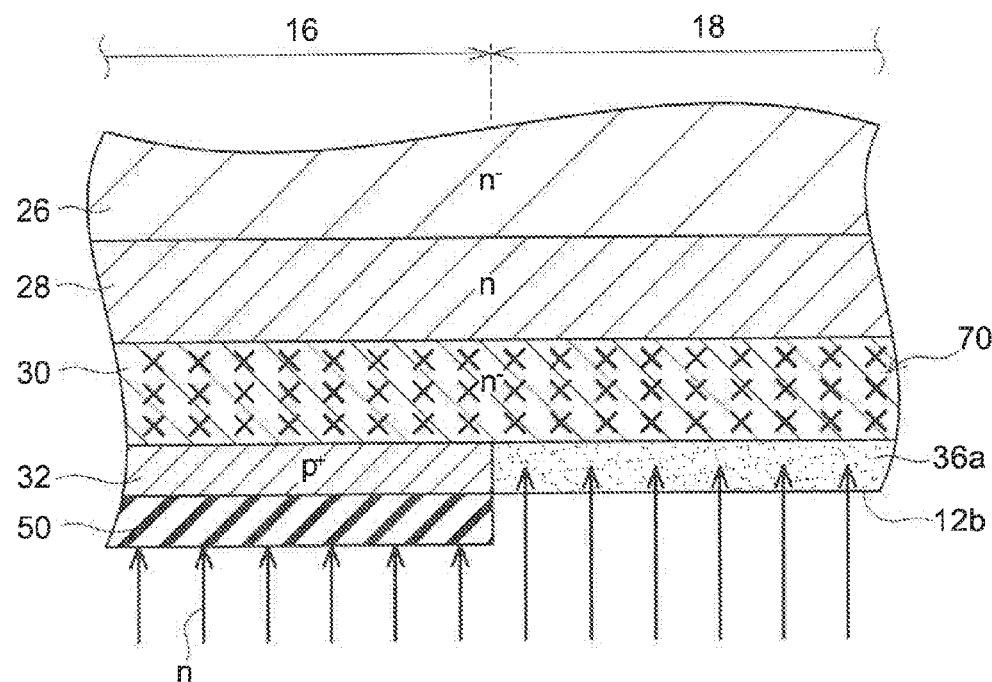
FIG. 5 illustrates an explanatory drawing for a process of implanting n-type impurities (amorphization process)

Subsequently, as shown in FIG. 5, a mask 50 covering the IGBT region 16 is formed on the lower surface 12b, and n-type impurities are implanted to the semiconductor substrate 12 from the lower surface 12b via the mask 50. The n-type impurities are not implanted to the IGBT region 16 covered by the mask 50. The n-type impurities are implanted to the diode region 18 not covered by the mask 50. At this occasion, implantation energy is adjusted such that the n-type impurities stop at the semiconductor region(s) in the vicinity of the lower surface 12b (substantially same depth range as the collector region 32). At this occasion, the n-type impurities are implanted in a higher concentration than the p-type impurity concentration of the collector region 32. Also at this occasion, the n-type impurities are implanted in such an amount that makes the semiconductor region(s) in the vicinity of the lower surface 12b in the diode region 18 amorphous (e.g., if the n-type impurities are boron, the implantation is performed with a dose amount of $8 \times 10^{14}$ atoms/cm$^2$ at a room temperature). It should be noted that, silicon of which the semiconductor substrate 12 is constituted loses its crystalline structure once it is made amorphous. In FIG. 5, the region that has been made amorphous is indicated with a reference numeral 36a. Upon completion of the n-type impurity implantation, the mask 50 is removed.

Figure 6:
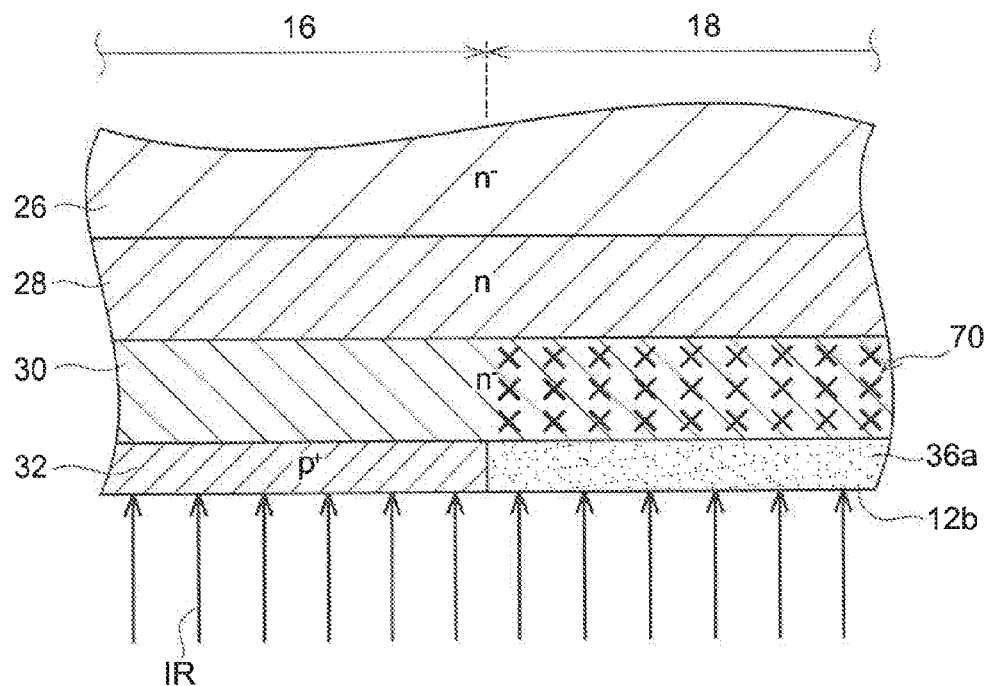
FIG. 6 illustrates an explanatory drawing for a process of irradiating infrared laser.

Subsequently, as shown in FIG. 6, the lower surface 12b is irradiated with infrared laser. At this occasion, the entirety of the lower surface 12b including the IGBT region 16 and the diode region 18 is irradiated with the infrared laser. The radiation of the infrared laser heats the semiconductor region(s) in the vicinity of the lower surface 12b. That is, the amorphous region 36a and the collector region 32 are heated herein. At this occasion, the amorphous region 36a has a much lower thermal conductivity than the collector region 32 having the crystalline structure. Due to this, heat does not transfer at a great degree from the amorphous region 36a to the low concentration region 30 positioned above the region 36a. Consequently, the temperature of the low concentration region 30 in the diode region 18 does not rise largely. As a result, most of the crystal defects are hardly eliminated in the low concentration region 30 in the diode region 18. Due to this, in the low concentration region 30 in the diode region 18, the high crystal defect density is maintained. On the other hand, heat is easily transferred from the collector region 32 to the low concentration region 30 positioned above the collector region 32. Therefore, the temperature of the low concentration region 30 in the IGBT region 16 rises much higher than the temperature of the low concentration region 30 in the diode region 18. Due to this, most of the crystal defects are eliminated in the low concentration region 30 in the IGBT region 16. Thus, after the radiation of the infrared laser, a state is obtained as shown in FIG. 6, in which the crystal defect region 70 exists in the low concentration region 30 in the diode region 18 but does not exist in the low concentration region 30 in the IGBT region 16.

Figure 7:
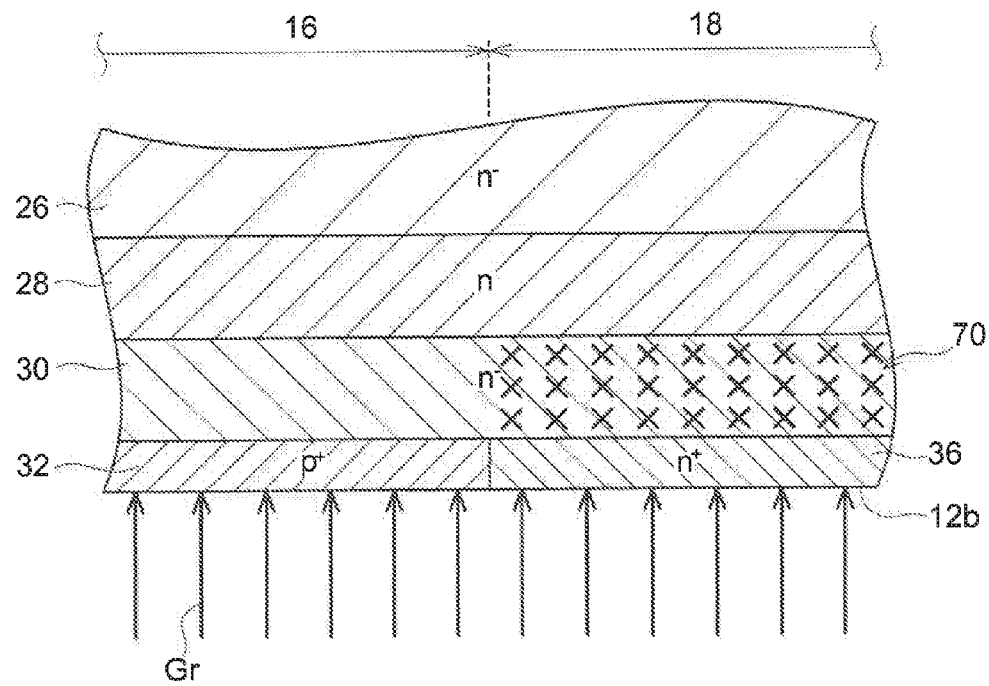
FIG. 7 illustrates an explanatory drawing for a process of irradiating green laser.

Next, as shown in FIG. 7, the lower surface 12b is irradiated with green laser. At this occasion, the entirety of the lower surface 12b including the IGBT region 16 and the diode region 18 is irradiated with the green laser. The radiation of the green laser heats the semiconductor region(s) in the vicinity of the lower surface 12b. The green laser can heat the semiconductor region(s) in the vicinity of the lower surface 12b to a higher temperature than the infrared laser can. When the amorphous region 36a is heated to a high temperature, the region 36a is crystallized. As mentioned above, since the n-type impurities have been implanted in the higher density than the p-type impurities in the region 36a, the crystallized region 36a becomes the n-type cathode region 36.

Thereafter, by forming the lower electrode 62, the semiconductor device 10 in FIG. 1 is completed.

As described above, in this manufacturing method, the amorphous region 36a is formed by implanting, after the crystal defect region 70 has been formed by the electron implantation, the n-type impurities to a narrower range (i.e., diode region) than the range where the electrons were implanted (i.e., IGBT region 16 and diode region 18). Thereafter, by heating the lower surface 12b by the laser, a majority of the crystal defects positioned above the collector region 32 having the crystalline structure is eliminated while the elimination of the crystal defects positioned above the amorphous region 36a is suppressed. Thus, the crystal defect region 70 can be maintained above the amorphous region 36a. Thereafter, by crystallizing the amorphous region 36a, the region 36a is transformed into the cathode region 36. Due to this, when the semiconductor substrate 12 is seen along its thickness direction, a distribution range of the cathode region 36 and a distribution range of the crystal defect region 70 can be substantially matched. According to this manufacturing method, a relative positional misalignment between the cathode region 36 and the crystal defect region 70 (in a lateral direction of the semiconductor substrate 12 (direction along a plane parallel to the lower surface 12b)) can be suppressed. Due to this, variations in the characteristic(s) of the IGBT and the property(s) of the diode can be suppressed. For example, if the crystal defect region 70 is arranged offset from the cathode region 36 toward an IGBT region 16 side, on-voltage of the IGBT rises. In addition, for example, if the crystal defect region 70 is arranged offset from the cathode region 36 toward an opposite side to the IGBT region 16, a reverse recovery loss is likely to be generated. According to the manufacturing method of the embodiment, as the relative positional misalignment between the cathode region 36 and the crystal defect region 70 can be suppressed, variations in the IGBT on-voltage and the diode reverse recovery characteristic can be suppressed. Therefore, variations in characteristics of the semiconductor devices 10 can be suppressed in mass production of the semiconductor devices 10.

Further, as in this manufacturing method, a mask for controlling a range to implant electrons becomes unnecessary, manufacturing cost of the semiconductor device 10 can be reduced.

Further, in the above-mentioned embodiment, crystal defects were formed by electrons implantation, but alternatively crystal defects may be formed by implantation of other type of charged particles, such as hydrogen ions and the like.

Further, in the above-mentioned embodiment, the crystal defects were formed by implanting the charged particles (electrons) to the semiconductor substrate 12 from a lower surface 12b side, but alternatively, the crystal defects may be formed by implanting the charged particles to the semiconductor substrate 12 from an upper surface 12a side. Further, the crystal defects may be formed by implanting the charged particles to the semiconductor substrate 12 both from the lower surface 12b side and the upper surface 12a side.

Further, in the above-mentioned embodiment, the majority of the crystal defects in the IGBT region 16 was eliminated by the heating process by the infrared laser, but alternatively crystal defects with a relatively high density may remain in the IGBT region 16. In this case also, a crystal defect density of the IGBT region 16 decreases relative to the diode region 18, and thus characteristic(s) of the IGBT and characteristic(s) of the diode can be separately adjusted. Further, in the above-mentioned embodiment, the crystal defect region 70 was formed by implantation of charged particles in the low concentration region 30, but alternatively the crystal defect region 70 may be formed in another region (e.g., drift region 26). Further, crystal defects may be formed entirely in a thickness direction of the semiconductor substrate 12 by implanting the charged particles so as to penetrate the semiconductor substrate 12. Even if the depth at which the crystal defects are formed is changed, heat is transferred differently in a range covered by the region 36a that was made amorphous in the heating process by the infrared laser and in a range outside thereof, and therefore, the densities of the crystal defects that remain after the heating process can be varied between these ranges. In this case also, the positional misalignment of the crystal defect region of the diode relative to the cathode region can be suppressed, and thereby variations in the characteristic(s) can be made less.

Further, in the above-mentioned embodiment, the heating process by the green laser (crystallization of the amorphous region 36a) was performed after the heating process by the infrared laser. However, the region 36a may be crystallized by the heating process by the infrared laser. That is, in the heating process by the infrared laser, a process of lowering the crystal defect density in the IGBT region 16 and a process of crystallizing the region 36a may be performed concurrently. In this case, the heating process by the green laser becomes unnecessary.

Further, in the above-mentioned embodiment, the implantation process of the charged particles (electrons) for forming the crystal defects was performed earlier than the implantation process of the n-type impurities for forming the amorphous region 36a. However, the implantation process of the n-type impurities for forming the amorphous region 36a may be performed earlier than the implantation process of the charged particles for forming the crystal defects.

Further, in the above-mentioned embodiment, a manufacturing method of an RC-IGBT was described. However, the art disclosed herein may be implemented to manufacturing various types of semiconductor devices that include a diode.

Relationships between constituent features of the above-mentioned embodiment and constituent features of the claims will be described. The lower surface 12b in the embodiment is an example of "a first surface" in the claims. The diode region 18 in the embodiment is an example of "a first range" in the claims. The IGBT region 16 of the embodiment is an example of "a second range" in the claims.

Some of the technical elements disclosed herein will hereafter be listed. It should be noted that each of the technical elements below is independently useful.

In a manufacturing method example disclosed herein, the crystallization of the region which has been made amorphous may comprise irradiating the first surface with second laser having a smaller wavelength than the first laser so as to heat the first range.

According to this configuration, the amorphous region can be crystallized suitably.

In a manufacturing method example disclosed herein, a diode may be formed in the first range, and an IGBT may be formed in the second range.

According to this configuration, characteristic(s) of the IGBT can be stabilized.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A method of manufacturing a semiconductor device including a diode, the method comprising:
    implanting charged particles into a first range and a second range in a semiconductor substrate from at least one of a first surface of the semiconductor substrate and a second surface of the semiconductor substrate located on an opposite side of the first surface so as to increase crystal defect densities in the first range and the second range;
    implanting n-type impurities into the first range from the first surface so as to make a region amorphous by changing the region from crystal state to amorphous state, the region being in the first range and disposed at the first surface;
    irradiating the first surface with a first laser after the implantation of the charged particles and the implantation of the n-type impurities so as to heat the first range and the second range, wherein the crystal defect density in the second range decreases more than the crystal defect density in the first range in the irradiation of the first laser so that a distribution is obtained after the irradiation of the first laser where the crystal defect density in the second range is lower than the crystal defect density in the first range; and
    crystalizing the region which has been made amorphous in or after the irradiation of the first laser.

2. The method of claim 1, wherein the crystallization comprises irradiating the first surface with second laser having a smaller wavelength than the first laser so as to heat the first range.

3. The method of claim 1, wherein a diode is formed in the first range, and an IGBT is formed in the second range.

4. The method of claim 1, wherein the charged particles are electrons.

* * * * *